United States Patent
Lackey

(10) Patent No.: US 7,996,739 B2
(45) Date of Patent: Aug. 9, 2011

(54) AVOIDING RACE CONDITIONS AT CLOCK DOMAIN CROSSINGS IN AN EDGE BASED SCAN DESIGN

(75) Inventor: David E. Lackey, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 112 days.

(21) Appl. No.: 12/557,623

(22) Filed: Sep. 11, 2009

(65) Prior Publication Data
US 2011/0066904 A1    Mar. 17, 2011

(51) Int. Cl.
*G01R 31/28*    (2006.01)
(52) U.S. Cl. ........................................ 714/727; 714/731
(58) Field of Classification Search .................. 326/537, 326/38; 716/6; 714/729, 726, 731, 744, 714/727
See application file for complete search history.

(56) References Cited

U.S. PATENT DOCUMENTS

| | | | |
|---|---|---|---|
| 5,001,731 A | | 3/1991 | Atwell, Jr. et al. |
| 5,008,618 A | * | 4/1991 | Van Der Star ................ 714/729 |
| 6,020,763 A | | 2/2000 | Gabillard |
| 6,131,173 A | * | 10/2000 | Meirlevede et al. .......... 714/726 |
| 6,442,722 B1 | * | 8/2002 | Nadeau-Dostie et al. .... 714/731 |
| 6,861,867 B2 | * | 3/2005 | West et al. ...................... 326/38 |
| 7,116,152 B2 | | 10/2006 | Kwon |
| 7,478,300 B2 | * | 1/2009 | Chelstrom et al. ............ 714/729 |
| 2008/0282122 A1 | * | 11/2008 | Guettaf .......................... 714/731 |
| 2010/0011264 A1 | * | 1/2010 | Pugliesi-Conti et al. ...... 714/731 |
| 2010/0180242 A1 | * | 7/2010 | Kalafala et al. ................... 716/6 |
| 2010/0188096 A1 | * | 7/2010 | Waayers et al. ............... 324/537 |

* cited by examiner

*Primary Examiner* — David Ton
(74) *Attorney, Agent, or Firm* — Gibb I.P. Law Firm, LLC; Michael J. LeStrange, Esq.

(57) ABSTRACT

A structure, system, and method block clock inputs to clock domains (using a computer). While the clock domain inputs are blocked, the structure, system, and method perform a first timing test only of signals that are transmitted within the clock domains (using the computer) by only observing latches that receive signals from sources within the clock domains. The structure, system, and method also unblock the clock inputs to the clock domains (using the computer). While the clock domain inputs are unblocked, the structure, system, and method perform a second timing test only of signals that are transmitted between the clock domains by only observing latches that receive signals from other clock domains.

24 Claims, 13 Drawing Sheets

AVOIDING RACE CONDITIONS AT CLOCK DOMAIN CROSSINGS IN AN EDGE BASED SCAN DESIGN

BACKGROUND

1. Field of the Invention

The embodiments of the invention generally relate to methods and systems for performing timing analysis and, more specifically, to methods, systems, and integrated circuit structures that separately test the timing characteristics within clock domains and timing characteristics between clock domains by selectively blocking or unblocking the inputs to clock domains.

2. Description of the Related Art

When performing timing analysis on integrated circuit structures (such as integrated circuit chips) traditional edge based multiplexer scan architectures can be exposed to race conditions at the interfaces between clock domains. A clock domain is a grouping of circuit structures (e.g., flip flops) that are driven by a common clock signal. A race condition or race hazard is a flaw in a system or process whereby the output and/or result of the process is unexpectedly and critically dependent on the sequence or timing of other events. The term originates with the idea of two signals racing each other to influence the output first. Race conditions can produce unpredictable results as the output may not be based upon logic, but instead may simply be based on which signal reaches a destination first.

Known solutions to race hazards include additional timing constraints where the race conditions are corrected for timing. However, such solutions are difficult to implement and add to the time needed to design the chip. Further, with conventional testing, the chip is tested one domain at a time, which adds to test patterns and test time and thus adversely impacts manufacturing cost.

Some testing systems, such as an Automatic Test Pattern Generation Tool, do not perform timing testing at domain crossings, which results in loss of test coverage at such domain crossings. Other systems such as Logic Built-In Self Test (BIST) methodologies, for which patterns are randomly generated on-chip, cannot accommodate race hazards because it is not possible to modify the random patterns in a way that would prevent transitions at domain crossings.

SUMMARY

In view of the foregoing, disclosed herein are computer-implemented methods of testing clock domains within an integrated circuit structure. One exemplary method blocks clock inputs to the clock domains (using a computer). While the clock domain inputs are blocked, the method performs a first timing test only of signals that are transmitted within the clock domains (using the computer) by only observing latches that receive signals from sources within the clock domains. The method also unblocks the clock inputs to the clock domains (using the computer). While the clock domain inputs are unblocked, the method performs a second timing test only of signals that are transmitted between the clock domains by only observing latches that receive signals from other clock domains.

The first timing test comprises simultaneously testing the signals that are transmitted within the clock domains. To the contrary, the second timing test comprises sequentially testing the signals that are transmitted between the clock domains. The method uses a first scan enable signal for the first timing test and uses a second scan enable signal for the second timing test. The first scan enable signal is different than the second scan enable signal.

The first timing test and the second timing test are used with alternating current (AC) testing, direct current (DC) testing and at-speed structure testing (ASST). The first timing test and the second timing test can use multiple test clock signals delayed from one another when performing AC testing. The first timing test and the second timing test use a feedback loop as a toggle to test downstream logic within the clock domains and to block clock signals that are transmitted between the clock domains when performing at-speed testing.

Systems are also described herein. One exemplary system for testing clock domains within integrated circuit structures comprises an integrated circuit structure and a plurality of clock domains within the integrated circuit structure. Each clock domain comprises a different section of the integrated circuit, and each clock domain operates according to its own clock signal that is different from the other clock signals. Controllers are positioned within each of the clock domains. The controllers block and unblock clock inputs to the clock domains. Further, a tester is operatively connected to the controllers.

While the clock domain inputs are blocked by the controllers, the tester performs a first timing test of signals that are transmitted within the clock domains by only allowing data capture in latches that receive signals from sources within the clock domains. To the contrary, while the clock domain inputs are unblocked by the controllers, the tester performs a second timing test only of signals that are transmitted between the clock domains by also allowing data capture in latches that receive signals from other clock domains.

Some system embodiments can include a feedback loop operatively connected to the controllers. The first timing test and the second timing test use the feedback loop as a toggle to test downstream logic within the clock domains and to block clock signals that are transmitted between the clock domains when performing at-speed testing.

In addition, integrated circuit structures are disclosed herein. One exemplary integrated circuit structure comprises a plurality of clock domains. Each clock domain utilizes a different section (physical or logical) of the integrated circuit, and each clock domain operates according to its own different clock signal. Controllers are positioned within each of the clock domains (again, the controllers block and unblock clock inputs to the clock domains) and a processor or test equipment is operatively connected to the clock domains.

While the clock domain inputs are blocked by the controllers, the processor or test equipment performs a first timing test only of signals that are transmitted within the clock domains by only allowing data capture in latches that receive signals from sources within the clock domains. While the clock domain inputs are unblocked by the controllers, the processor performs a second timing test only of signals that are transmitted between the clock domains by also allowing data capture in latches that receive signals from other clock domains.

The integrated circuit structure can include a feedback loop operatively connected to the controllers. The first timing test and the second timing test can use the feedback loop as a toggle to test downstream logic within the clock domains and to block clock signals that are transmitted between the clock domains when performing at-speed testing.

BRIEF DESCRIPTION OF THE DRAWINGS

The embodiments of the invention will be better understood from the following detailed description with reference to the drawings, which are not necessarily drawing to scale and in which.

DETAILED DESCRIPTION

The embodiments of the invention and the various features and advantageous details thereof are explained more fully with reference to the non-limiting embodiments that are illustrated in the accompanying drawings and detailed in the following description.

As mentioned above, conventional systems have difficulty handling race conditions that can exist at clock domain boundaries. In view of the foregoing, the present embodiments separately test the timing characteristics within clock domains and timing characteristics between clock domains by selectively blocking or unblocking the inputs to clock domains.

The embodiments herein utilize controllers at the source of each clock domain. Such controllers are capable of selecting whether the test clock signal will be propagated to the domain or not. The embodiments herein utilizes two types of scan enable signal, a first scan enables signal for latches internal to clock domains, and a second scan enable signal for latches that receive data from other clock domains.

In the first mode of testing, all domains receive clocks signals, but latches that receive data from other domains are held in scan state (will not capture clock signals from other domains, but only capture clock signals from the scan chain instead) by using their specific scan enable signal. The majority of patterns use this mode, and the only testing that does not happen is at the domain crossings.

In the second mode of testing, each domain is tested individually (fault coverage clean-up from first mode). The clock is uniquely pulsed for each domain, one domain at a time. In the second mode of testing, the scan enable signal is sent to all latches such that they receive data from the functional path rather than from the scan path.

Figure 1:
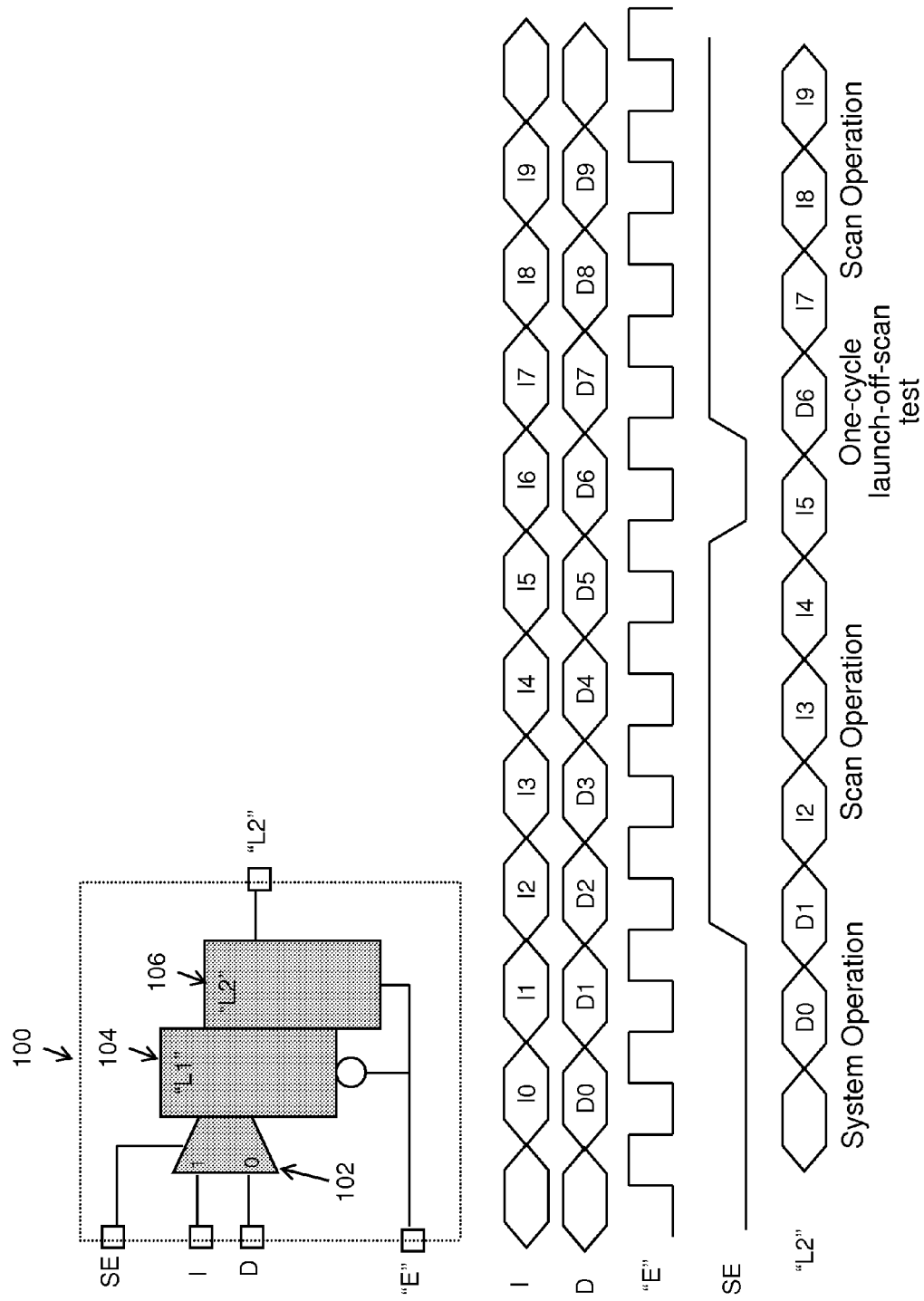
FIG. 1 is a schematic diagram illustrating a latch structure and signals used by such a structure.

Referring to FIG. 1, a circuit 100 is illustrated that includes a multiplexer 102 and two latches 104, 106. The various signals provided to the multiplexer 102 and latches 104, 106 include a scan enable (SE) signal, a scan in (I) signal, a data in (D) signal, and an external test clock (E) signal. The output from the circuit 100 is labeled as signal L2. As shown in the lower portion of FIG. 1, based on the various data and scan signals, the output L2 can represent system operation, scan operation, one test cycle of launch-off-scan (LOS), and an additional scan operation. Thus, FIG. 1 illustrates an edge-scan flop operation overview.

Figure 2:
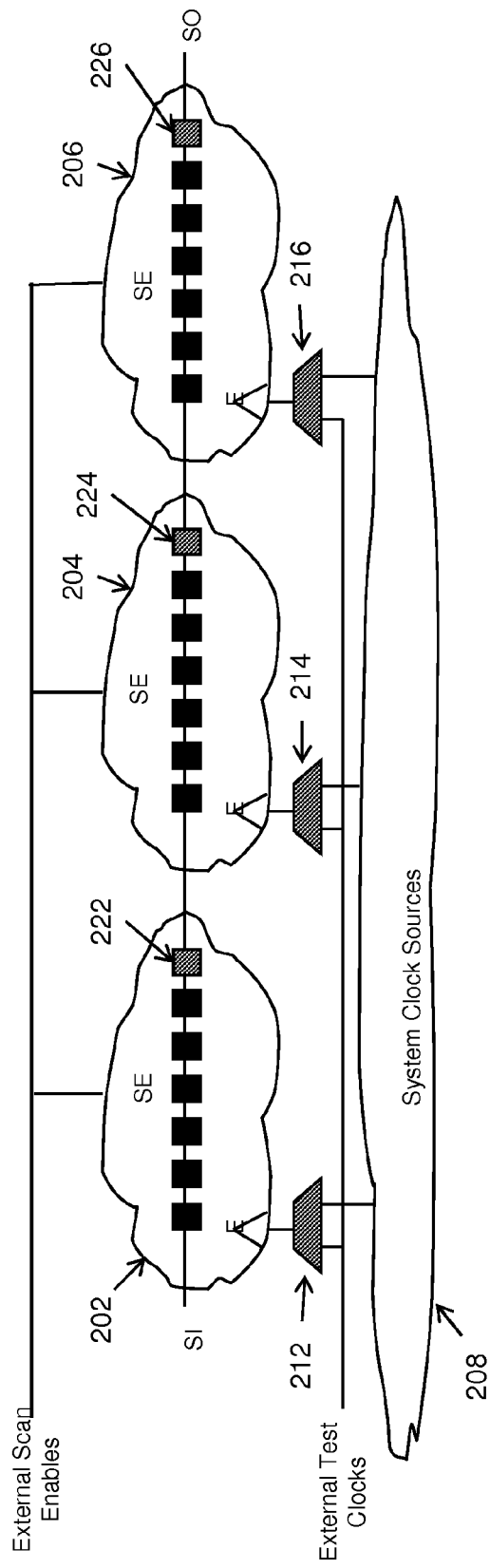
FIG. 2 is a schematic diagram illustrating clock domains and signals used by such structures and depicts clock domain crossings occurring in the scan capture paths.

FIG. 2 illustrates various clock domains 202, 204, and 206 each of which receives an external test clock signal through a multiplexer 212, 214, 216. The system clock source is shown as item 208. Within domains, scan chains operate using a functional "edge" clock. Between domains 202, 204, 206, lockup latches 222, 224, 226 are used as a method to avoid severe timing race condition. Lockup latches 222, 224, 226 avoid the need for difficult clock basining solution (making test clock latency common throughout chip).

Figure 3:
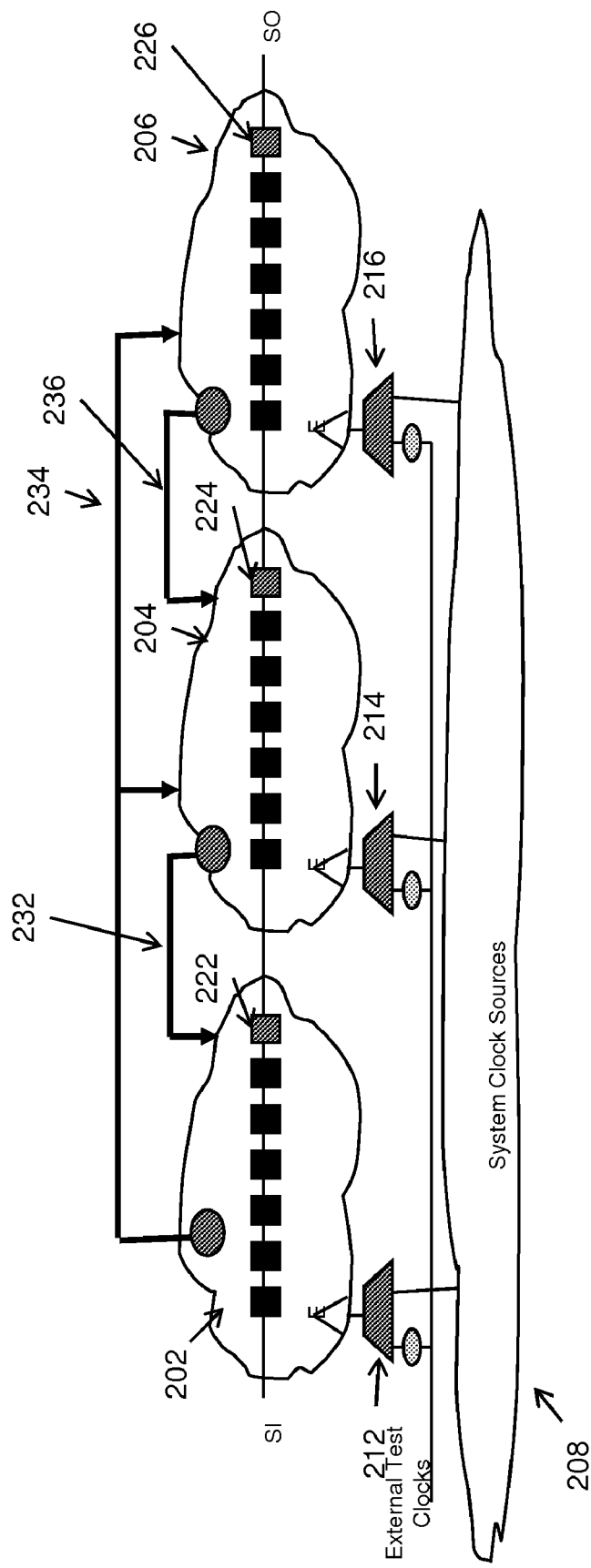
FIG. 3 is a schematic diagram illustrating clock domains and signals used by such structures and depicts clock domain crossings occurring in the functional data capture paths.

FIG. 3 illustrates the structures associated with direct current (DC) and AC testing and includes mechanisms 232, 234, 236 (which can be physical items such as wiring or logical items such as internal logical connections) which pass clock signals between the various clock domains 202, 204, 206. DC testing is performed to essentially eliminate stuck-fault coverage within clock domains, between clock domains, within asynchronous paths, set/reset structures, clock gates, etc. In addition, such DC testing is used to screen for logic used by other tests (BIST/Macro Tests, ASST, etc.).

With respect to clock domain considerations in DC testing of FIG. 3, data is captured within domains using a functional mode with the common edge clock. Between the domains, timing closure can be problematic, because the test clock differs from the functional clock prior to the root of the edge clock tree. This presents a more difficult test clock (edge) basining problem and FIG. 3 shows that fixing timing hazards or races for test-only across domain boundaries is difficult and should be avoided. It is difficult either to provide equivalent clock latency across all domains to all latches, or alternatively to add unique delay before input latches at domain crossings that would account for the differences in clock latency between the domains at said domain crossings.

Figure 4:
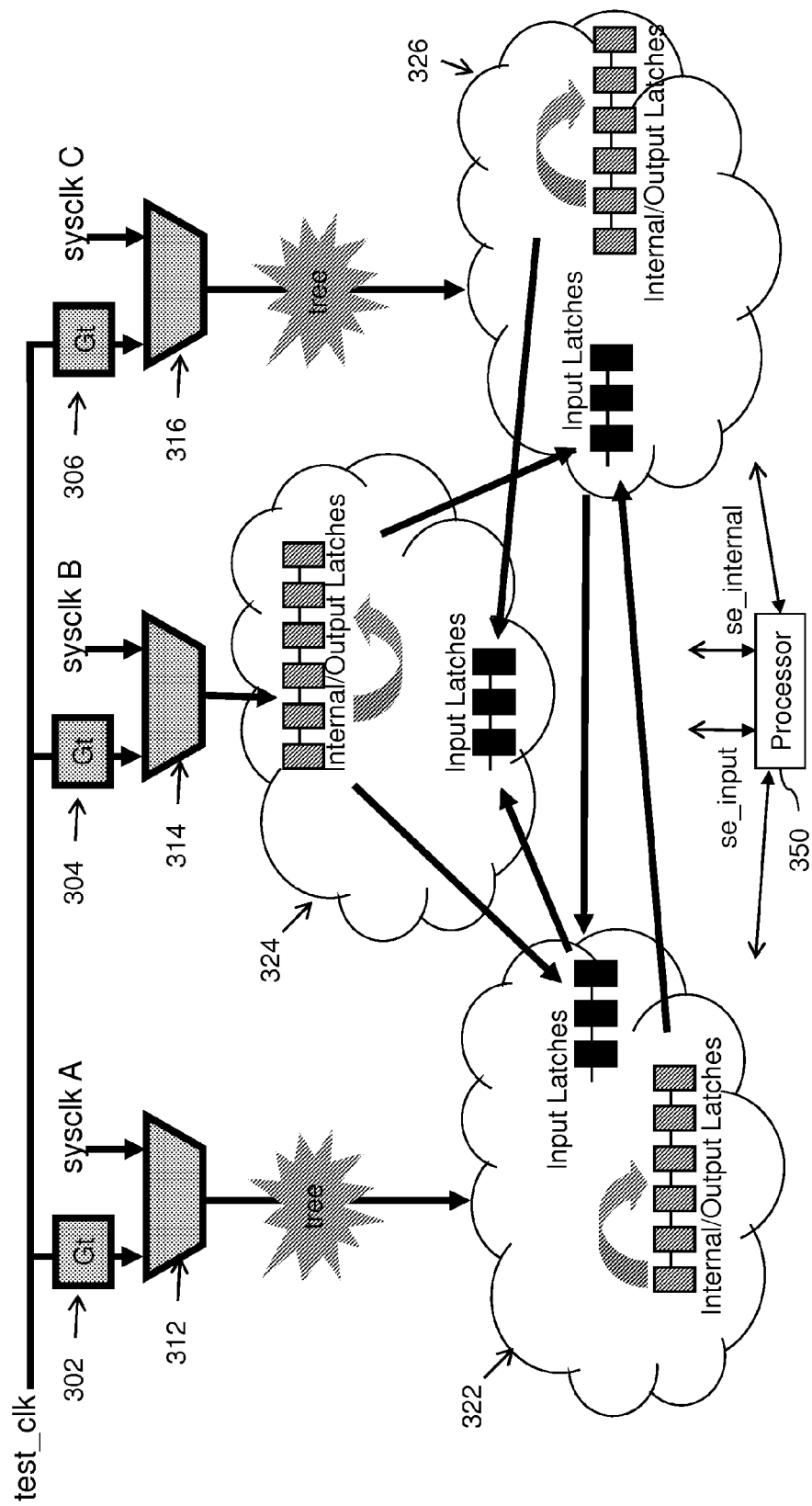
FIG. 4 is a schematic diagram illustrating clock domains and signals used by such structures and used for DC, AC, and at-speed testing.

In view of this, embodiments herein utilize the structure and method illustrated in FIG. 4. More specifically, FIG. 4 illustrates a system that comprises a plurality of clock domains 322, 324, 326. Each clock domain 322, 324, 326 utilizes a different section (physical or logical) of the integrated circuit, and each clock domain operates according to its own different clock signal (sysclk A, sysclk B, sysclk C).

Controllers (e.g., gates 302, 304, 306 and multiplexers 312, 314, 316) are positioned within each of the clock domains (the controllers block and unblock clock inputs to the clock domains) and are operatively connected to the various clock domains 322, 324, 326. By being "operatively" connected, as used herein, two devices are directly or indirectly connected (by direct wiring, indirect wiring, wireless connections, through intermediate devices, intermediate trees, etc.).

A processor 350 is operatively connected to the clock domains. The processor 350 supplies the scan enable signal for the input/output latches (se_input) and the scan enable signal for the internal latches (se_internal) to the clock domains 322, 324, 326. While the clock domain inputs are blocked by the controllers 302, 304, 306 and 312, 314, 316, the processor 350 performs a first timing test only of signals that are transmitted within the clock domains by only allowing data capture in latches that receive signals from sources within the clock domains (internal/output latches). While the clock domain inputs are unblocked by the controllers 302, 304, 306 and 312, 314, 316, the processor 350 performs a second timing test only of signals that are transmitted between the clock domains by also allowing data capture in latches that receive signals from other clock domains (input latches).

As shown in FIG. 4, the internal/output latches are tested during both modes, while the input latches are tested one domain at a time only. The first timing test comprises simultaneously testing the signals that are transmitted within the clock domains (internal/output latches). To the contrary, the second timing test comprises sequentially testing the signals that are transmitted between the clock domains (input latches). This embodiment uses a first scan enable signal for the first timing test and uses a second scan enable signal for the second timing test. The first scan enable signal is different that the second scan enable signal. This allows the embodiments herein to drive for the most stuck-at coverage, with minimal patterns and test time.

While the foregoing is utilized with DC testing, alternating current (AC) testing is also important with respect to domain crossings, asynchronous paths, clock gates, ASST-untested domains, etc. AC testing within domains is standard with generalized scan design (GSD). Thus, the embodiments herein perform parallel AC testing similar to the DC testing discussed above. The first timing test and the second timing test can use multiple test clock signals (test_clk1, test_clk2) delayed from one another when performing AC testing (see FIG. 5), and performing a delay test for domain crossings.

Figure 5:
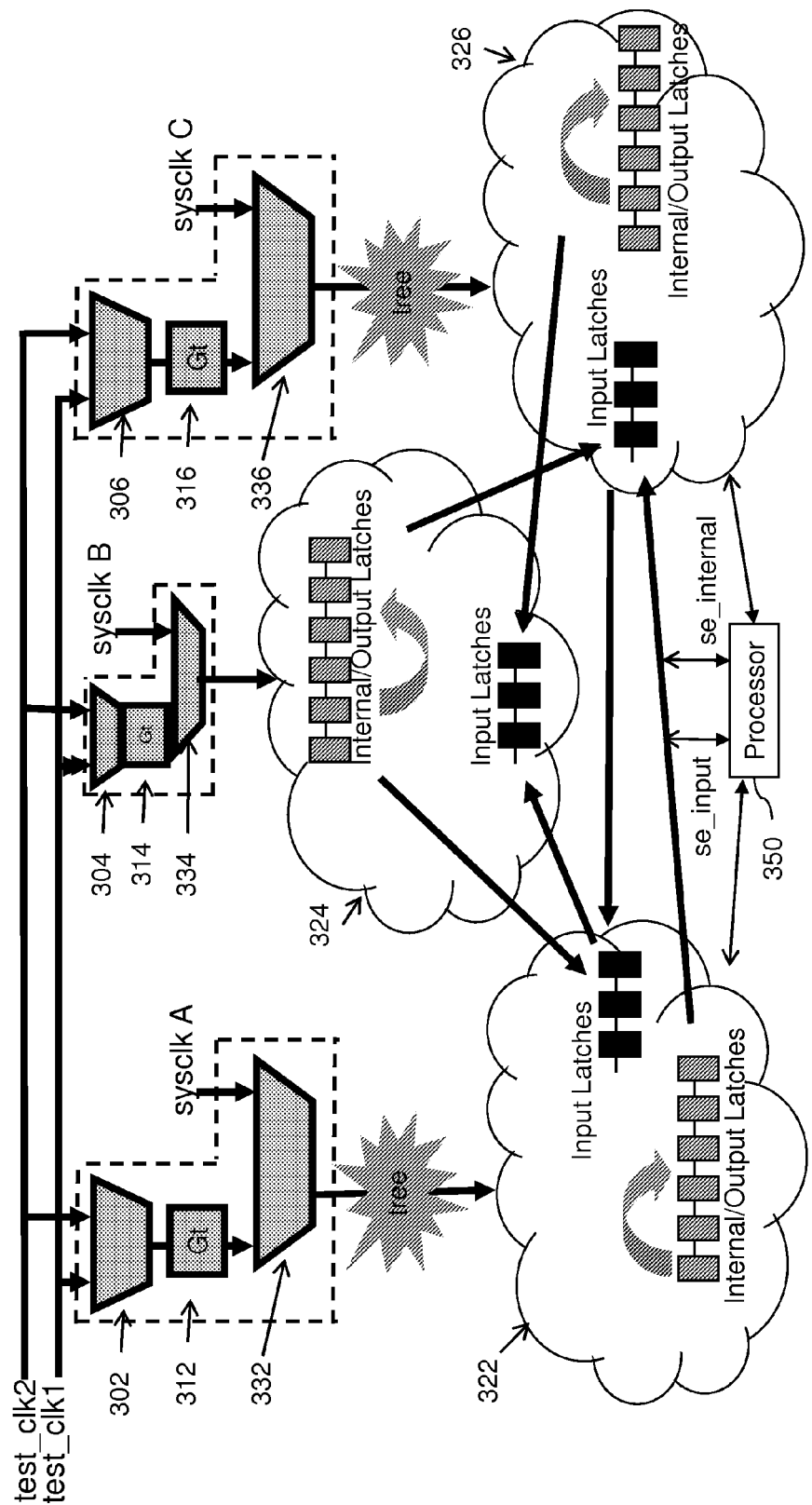
FIG. 5 is a schematic diagram illustrating clock domains and signals used by such structures, for additional ability in AC testing to provide multiple test clocks for the purpose of testing delays in paths that are domain crossings.

Thus, the structure shown in FIG. 5 is substantially similar to that shown in FIG. 4 except for the inclusion of an additional multiplexer 332, 334, 336. The additional multiplexer allows for the selection between the different clock signals (test_clk1, test_clk2). As with the structures shown in FIG. 4, in FIG. 5 the internal/output latches are tested during both modes, while the input latches are tested one domain at a time only. The first timing test comprises simultaneously testing the signals that are transmitted within the clock domains (internal/output latches). To the contrary, the second timing test comprises sequentially testing the signals that are transmitted between the clock domains (input latches). This embodiment also uses a first scan enable signal for the first timing test and uses a second scan enable signal for the second timing test.

Figure 6:
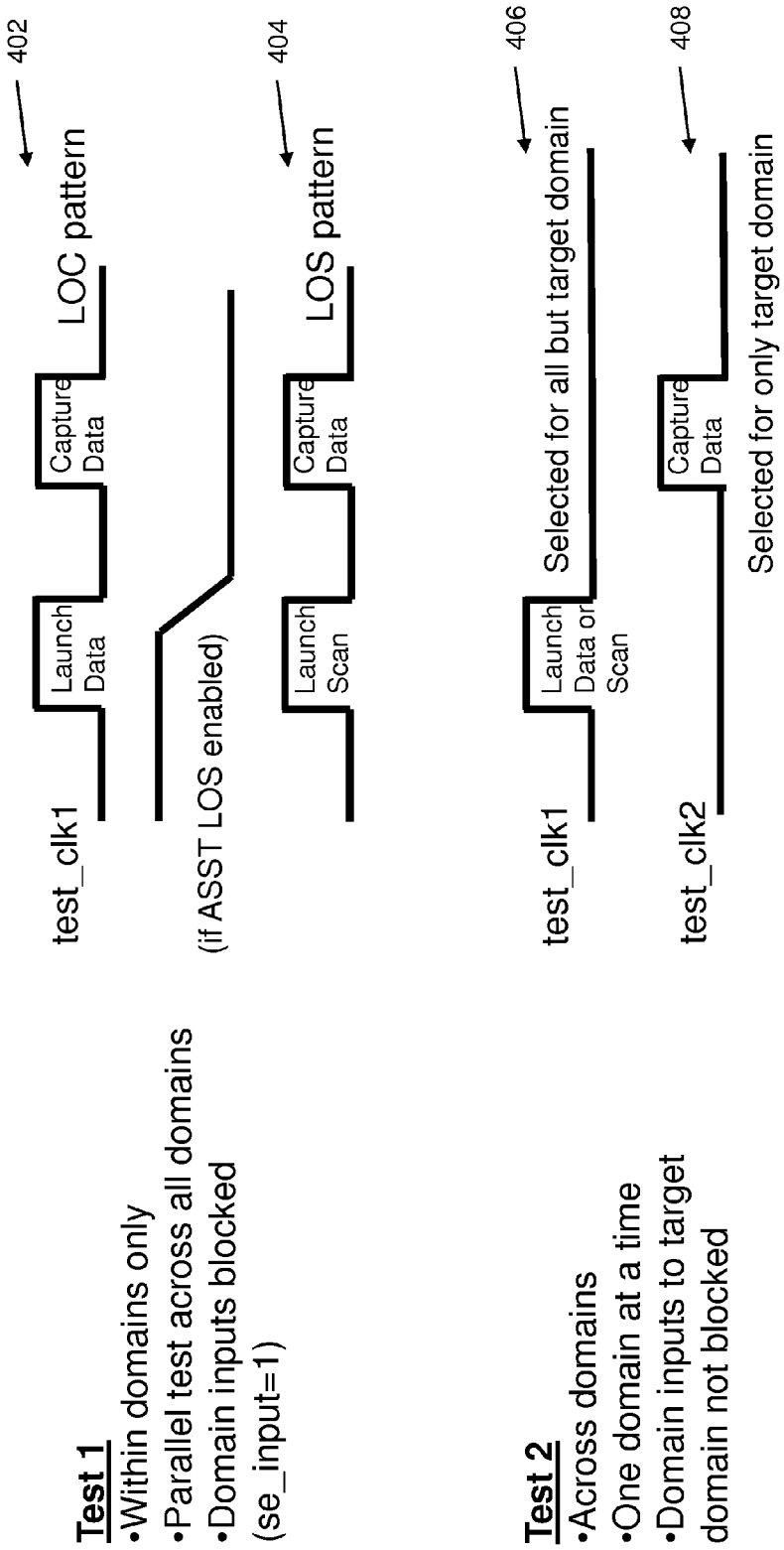
FIG. 6 is a schematic diagram illustrating signals used by a latch structure for AC testing.

This process is also graphically shown in FIG. 6 where, in items 402 during test 1 (that, again, is performed within domains only and is performed in parallel across all domains, with the domain inputs blocked) the test_clk1 signal includes a launch data element and a capture data elements for the launch-off-capture (LOC) process. In item 404, during test 1 the test_clk1 signal includes a launch data element and a capture data element for the launch-off-scan (LOS) process.

In FIG. 6, items 406 and 408 represent test 2. Item 406 utilizes test_clk1 that includes a launch data on scan where all the latches are selected except for the target domain. Similarly, item 408 utilizes test_clk2 that has a capture data selected for only the target domain. Again, test 2 is performed across domains, one domain at a time, with the domain inputs only to the target domain unblocked.

Figure 7:
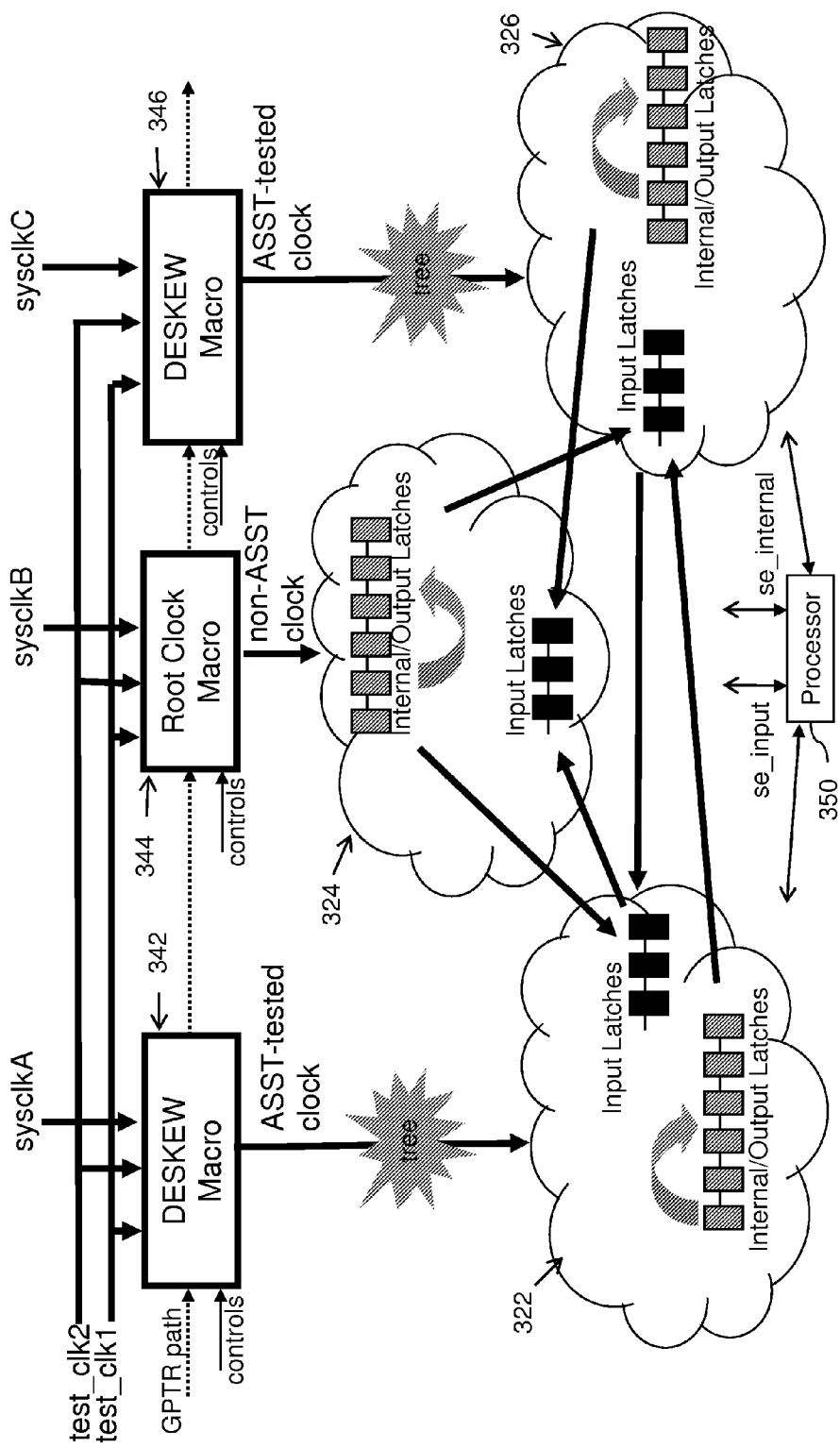
FIG. 7 is a schematic diagram illustrating clock domains and signals used by such structures, showing clock controllers used for DC, AC, and at-speed testing.

FIG. 7 illustrates a different embodiment that includes a macro for root clock control in the chip environment. The structure shown in FIG. 7 is similar to that shown in FIG. 5, except for the replacement of the controllers with various macros. For example, deskew macros 342 and 346 (for domains also capable of at-speed testing) and root clock macro 344 (for domains only capable of DC and AC testing but not at-speed testing) can be operatively connected to a control item (such as the processor 350).

The structure shown in FIG. 7 operates similarly to those discussed above. Thus, FIG. 7 illustrates an integrated circuit structure that comprises a plurality of clock domains 322, 324, 326. Each clock domain 322, 324, 326 utilizes a different section (physical or logical) of the integrated circuit, and each clock domain operates according to its own different clock signal (sysclk A, sysclk B, sysclk C). Controllers 342, 344, 346 are positioned within each of the clock domains (the controllers 342, 344, 346 block and unblock clock inputs to the clock domains) and are operatively connected to the various clock domains 322, 324, 326. The processor 350 supplies the scan enable signal for the input/output latches (se_input) and the scan enable signal for the internal latches (se_internal) to the clock domains 322, 324, 326. While the clock domain inputs are blocked by the controllers 342, 344, 346, the processor 350 performs a first timing test of signals that are transmitted within the clock domains by only observing latches that receive signals from sources within the clock domains (internal/output latches). While the clock domain inputs are unblocked by the controllers, the processor 350 performs a second timing test only of signals that are transmitted between the clock domains by only observing latches that receive signals from other clock domains (input latches).

Figure 8:
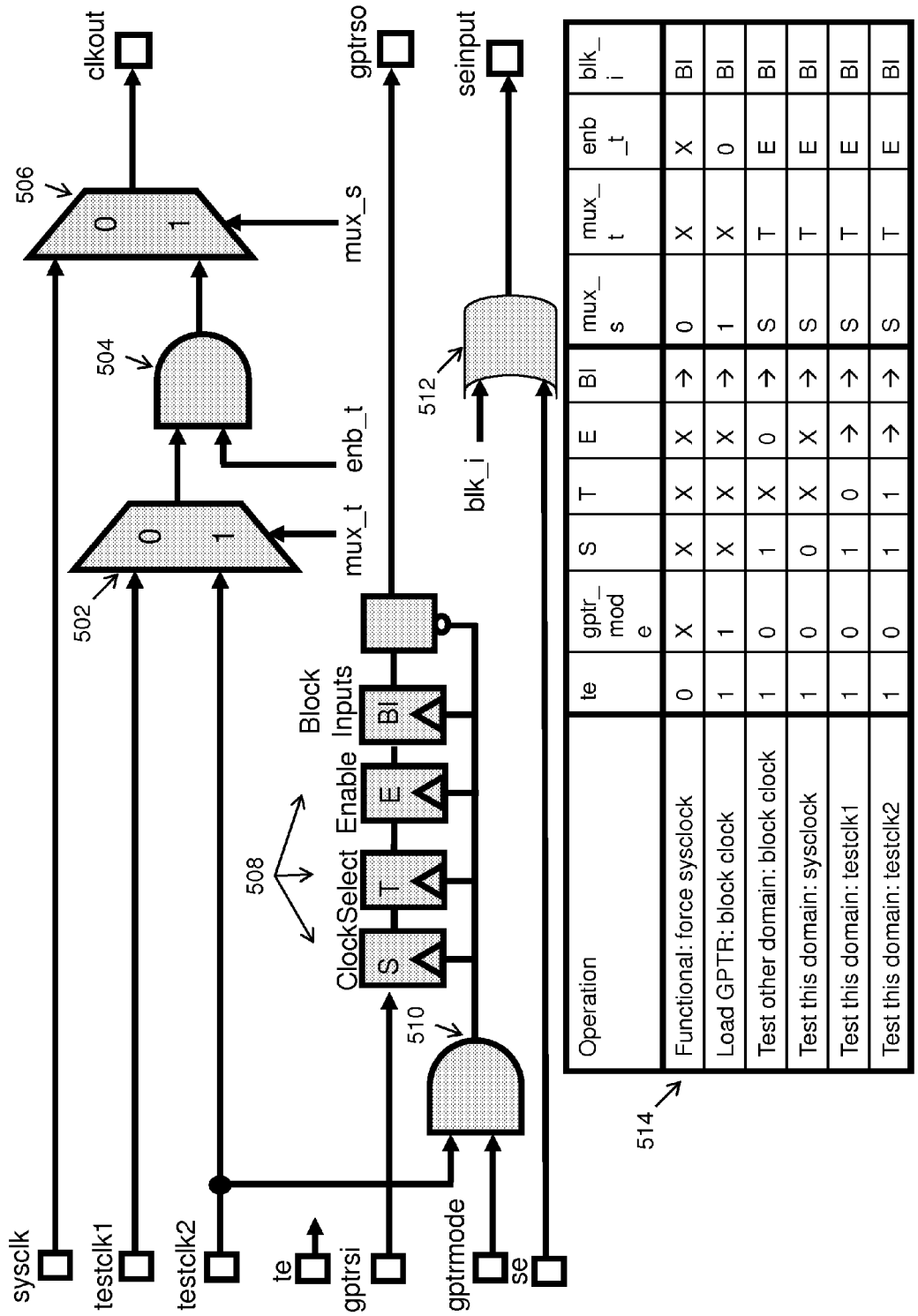
FIG. 8 is a schematic diagram illustrating a design of a clock controller used for DC, AC, and at-speed testing.
Figure 9:
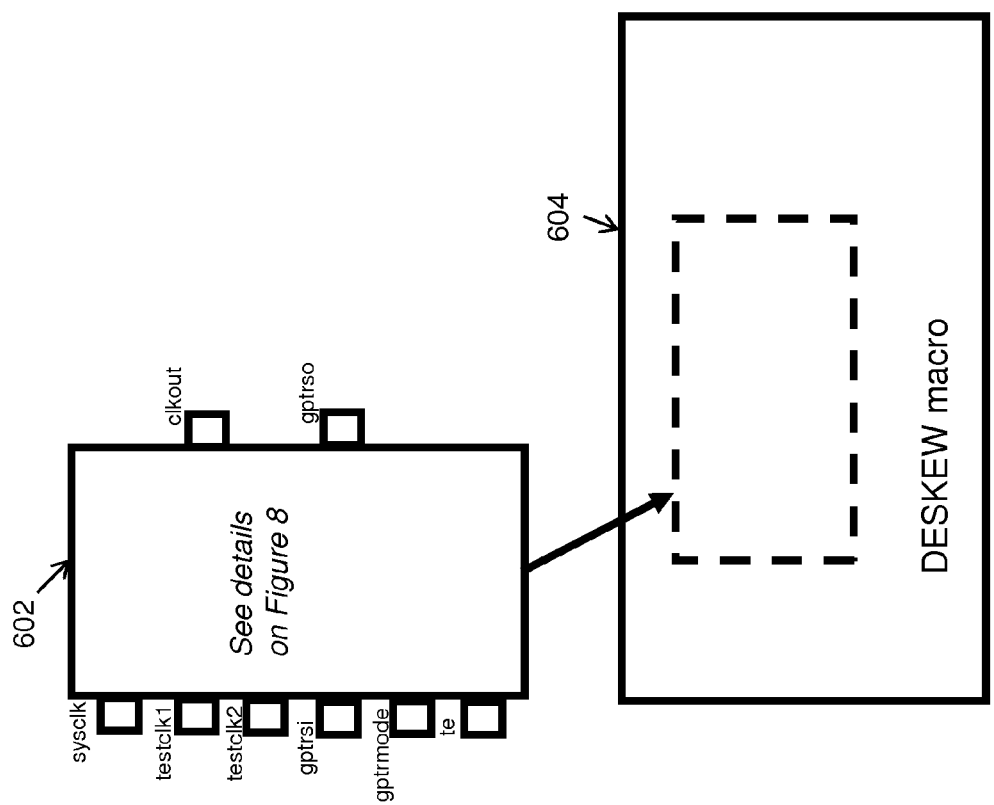
FIG. 9 is a schematic diagram illustrating a macro structure for clock control capable of at-speed testing, which also includes the clock controller shown in FIG. 8

FIG. 8 illustrates one example of how the deskew macro 342, 346 can be implemented. The macro element illustrated in FIG. 8 is shown as item 602 and FIG. 9 and the element 602 comprises part of the deskew macro 604. Note that the example of the deskew macro in FIGS. 8 and 9 is only one example of how the macro could be enabled and those ordinarily skilled in the art would understand that the macro could take many other forms and that the embodiments herein are not limited to the specific example illustrated in FIGS. 8 and 9.

In the example shown in FIG. 8, a multiplexer 502 receives the various test clock signals (testclk1, testclk2). This multiplexer 502 is also controlled by a mux_t signal and provides output to an AND gate 504. The AND gate 504 also receives input from an enb_t signal to provide output to a second multiplexer 506. Based on input from the system clock (sysclk), a mux_s signal, and the output from the AND gate 504, the multiplexer 506 produces a clock output (clkout).

Another AND gate 510 receives input from the second test clock signal (testclk2) and from a gptrmode signal. Various latches 508 respond to a gptrsi input signal and the output from the AND gate 510 to provide a gptrso output signal. In addition, logic element 512 receives input from a scan enable (se) signal and a blk_i signal to produce a seinput signal. As shown in charge 514, these elements allow various operations to take place. For example, a functional operation which forces the system clock can be enabled with the appropriate signals listed in charge 514. Similarly, a load GPTR operation that both allows shift load of programmable register 508, and also blocks the clock can be performed. An operation that tests another domain (blocking the clock) can be performed as well as operations that test the current domain (using the system clock signal (sysclock), first test clock signal (testclk1), or second test clock signal (testclk2)).

As mentioned above, the embodiments herein are useful in AC mode, DC mode and at-speed mode. With embodiments herein, the first timing test and the second timing test use a feedback loop as a toggle to test downstream logic within the clock domains and to block clock signals that are transmitted between the clock domains when performing at-speed testing.

For at-speed testing, embodiments herein use a separate scan_input signal verses a scan_internal signal at domain input flops and also add a fencing mechanism (a feedback mechanism) at the domain input. The fencing mechanism is utilized because listening to a scan chain during at-speed test operation is a problem for domain crossings in the scan chain (e.g., for example, where an asynchronous scan chain path runs an at-speed test with multiple clocks running in parallel). It is not desirable to run the scan chains at speed, but this would be necessary for the domain data input latches. The fencing mechanism accommodates the situation by providing a toggle to test downstream logic within the clock domains and to block clock signals that are transmitted between the clock domains when performing at-speed testing.

Figure 10:
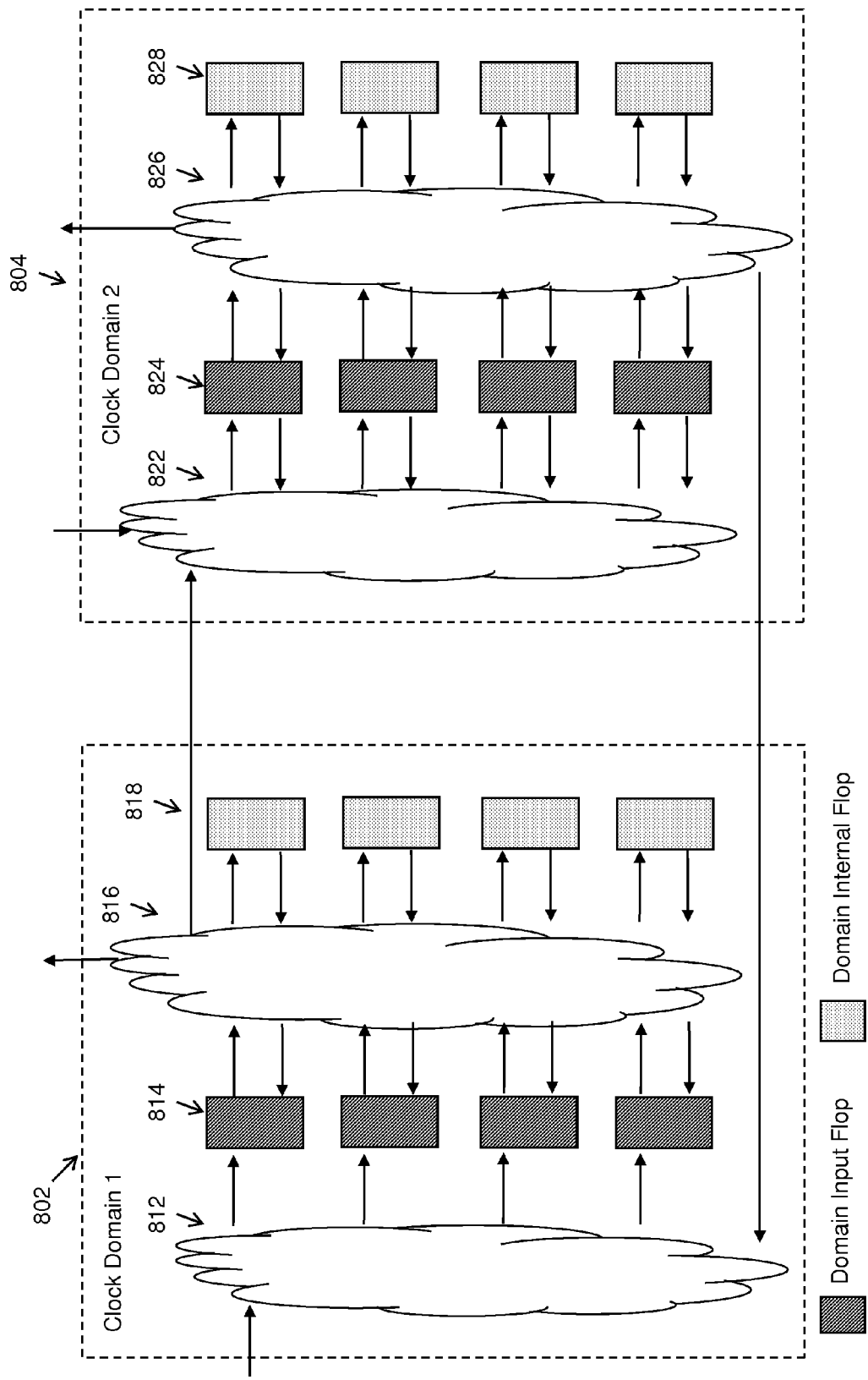
FIG. 10 is a schematic diagram illustrating clock domains and signals used by such structures.

FIG. 10 illustrates different clock domains 802, 804 that include domain input flip flops 814, 824 (that receive signals from external sources 812, 822) and the domain internal flip flops 818, 828 (that receive signals from internal sources 816, 826). As with the previous embodiments, while the clock domain inputs 814, 824 are blocked by controllers, the tester performs a first timing test of signals that are transmitted within the clock domains by only observing latches 818, 828 that receive signals from sources within the clock domains 816, 826. To the contrary, while the clock domain inputs 814, 824 are unblocked by the controllers, the tester performs a second timing test only of signals that are transmitted between the clock domains by only observing latches 814, 824 that receive signals from other clock domains 812, 822.

Figure 11:
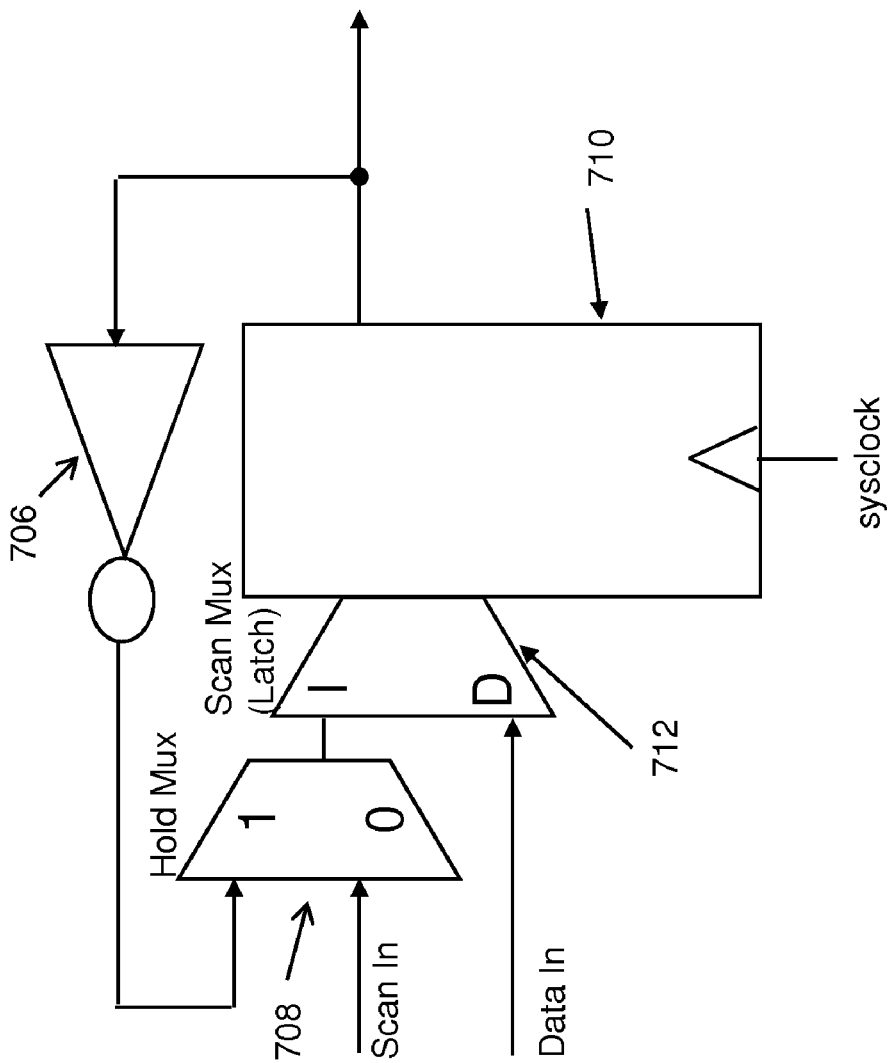
FIG. 11 is a schematic diagram illustrating a latch structure that provides toggle ability in at-speed testing for input latches that capture data from other domain(s)
Figure 12:
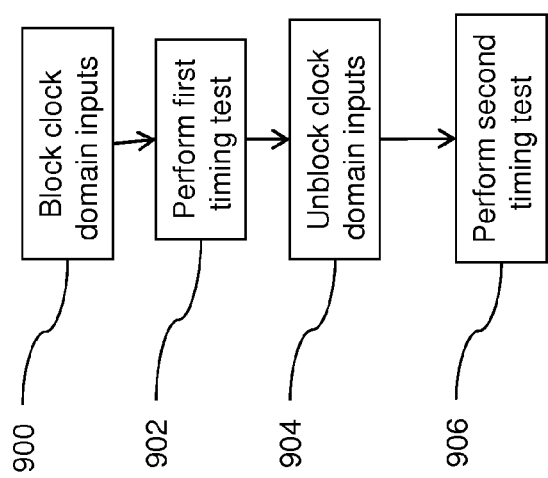
FIG. 12 is a flow diagram of a design process used in semiconductor design, manufacture, and/or test.

As shown in FIG. 11, some system embodiments herein can include a feedback loop operatively connected to the controllers to provide a toggle to test downstream logic within the clock domains and to block clock signals that are transmitted between the clock domains when performing at-speed testing. The structures shown in FIG. 12 is a latch 710 that includes a multiplexer 712 that receives a data in (D) signal and output from the second multiplexers 708. The second multiplexers 708 receives input from the scan in signal and from the feedback mechanisms 706 (inverter, etc.). The feedback mechanisms 706 takes the output from the latch 710 and returns it to the multiplexers 708 to thereby provide the toggle mechanism, as mentioned above.

FIG. 12 is a flowchart illustrating the methodology utilize by the embodiments herein. More specifically, in item 900, the method blocks clock inputs to the clock domains (using a computer, processor, or controller). While the clock domain inputs are blocked, the method performs a first timing test only of signals that are transmitted within the clock domains (using the computer, processor, or controller) by only observing latches that receive signals from sources within the clock domains in item 902. In item 904, the method also unblocks the clock inputs to the clock domains (using the computer, processor, or controller). While the clock domain inputs are unblocked, the method performs a second timing test only of signals that are transmitted between the clock domains by only observing latches that receive signals from other clock domains in item 906.

The first timing test 902 comprises simultaneously testing the signals that are transmitted within the clock domains. To the contrary, the second timing test 906 comprises sequentially testing the signals that are transmitted between the clock domains. The method uses a first scan enable signal for the first timing test 902 and uses a second scan enable signal for the second timing test 906. The first scan enable signal is different that the second scan enable signal.

The first timing test 902 and the second timing test 906 are used with alternating current (AC) testing, direct current (DC) testing and at-speed structure testing (ASST). The first timing test 902 and the second timing 906 test can use multiple test clock signals delayed from one another when performing AC testing. The first timing test 902 and the second timing test 906 can use a feedback loop as a toggle to test downstream logic within the clock domains and to block clock signals that are transmitted between the clock domains when performing at-speed testing.

The resulting integrated circuit chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments of the invention can take the form of an entirely hardware embodiment, an entirely software embodiment or an embodiment including both hardware and software elements. In a preferred embodiment, the invention is implemented in software, which includes but is not limited to firmware, resident software, microcode, etc.

Furthermore, the embodiments of the invention can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 13:
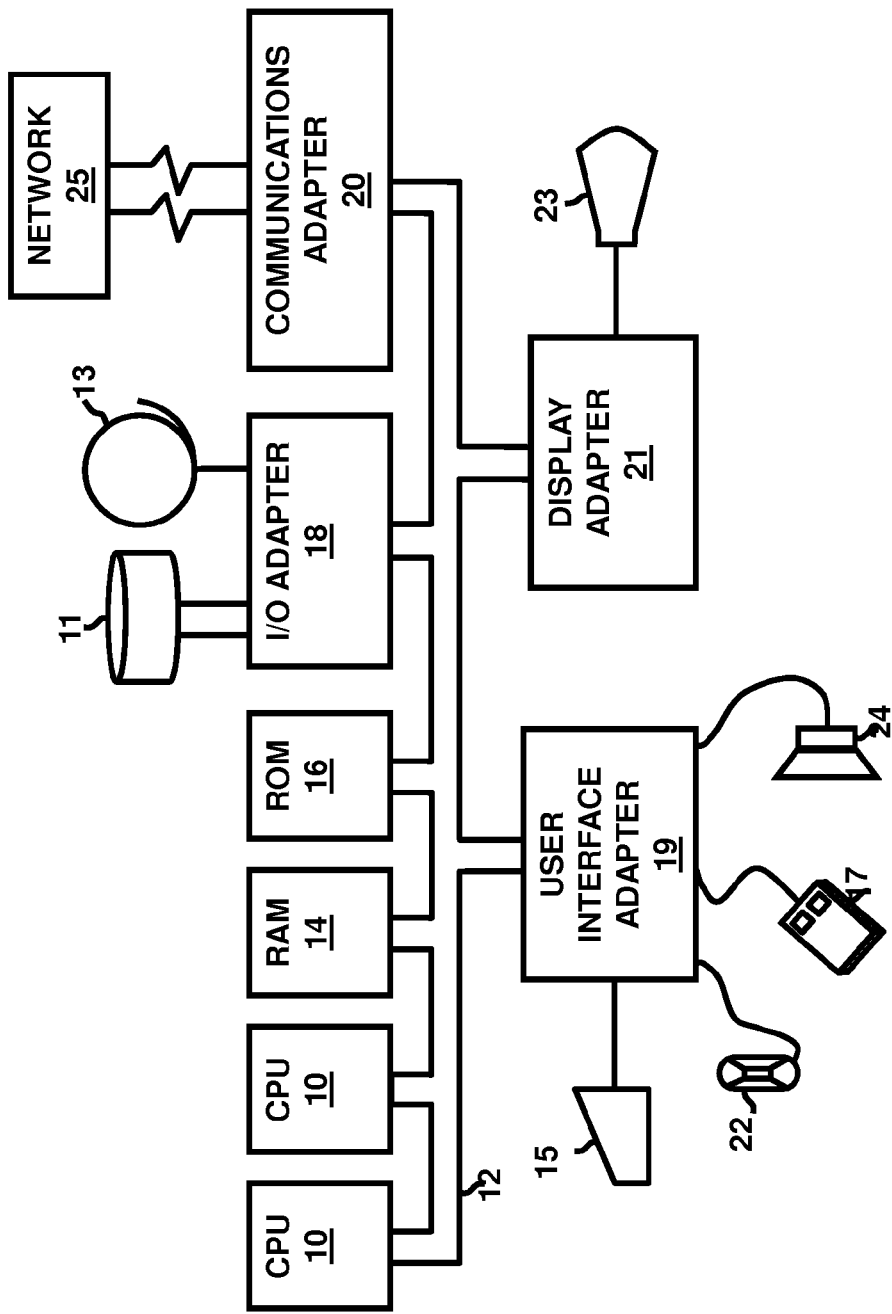
FIG. 13 is a schematic diagram illustrating an exemplary hardware environment that can be used to implement the embodiments of the invention.

A representative hardware environment for practicing the embodiments of the invention is depicted in FIG. 13. This schematic drawing illustrates a hardware configuration of an information handling/computer system in accordance with the embodiments of the invention. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments of the invention. The system further includes a user interface adapter 19 that connects a keyboard 15, mouse 17, speaker 24, microphone 22, and/or other user interface devices such as a touch screen device (not shown) to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

It should be understood that the corresponding structures, materials, acts, and equivalents of all means or step plus function elements in the claims below are intended to include any structure, material, or act for performing the function in combination with other claimed elements as specifically claimed. Additionally, it should be understood that the above-description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiments were chosen and described in order to best explain the principles of the invention and the practical application, and to enable others of ordinary skill in the art to understand the invention for various embodiments with various modifications as are suited to the particular use contemplated. Well-known components and processing techniques are omitted in the above-description so as to not unnecessarily obscure the embodiments of the invention.

Finally, it should also be understood that the terminology used in the above-description is for the purpose of describing particular embodiments only and is not intended to be limiting of the invention. For example, as used herein, the singular forms "a", "an" and "the" are intended to include the plural forms as well, unless the context clearly indicates otherwise. Furthermore, as used herein, the terms "comprises", "comprising," and/or "incorporating" when used in this specification, specify the presence of stated features, integers, steps, operations, elements, and/or components, but do not preclude the presence or addition of one or more other features, integers, steps, operations, elements, components, and/or groups thereof.

What is claimed is:

1. A computer-implemented method of testing clock domains within an integrated circuit structure, said method comprising:
    blocking clock inputs to said clock domains using a computer;
    while said clock domain inputs are blocked, performing a first timing test only of signals that are transmitted within said clock domains using said computer;
    unblocking said clock inputs to said clock domains using said computer; and
    while said clock domain inputs are unblocked, performing a second timing test only of signals that are transmitted between said clock domains.

2. The method according to claim 1, said first timing test comprising simultaneously testing said signals that are transmitted within said clock domains.

3. The method according to claim 1, said second timing test comprising sequentially testing said signals that are transmitted between said clock domains.

4. The method according to claim 1, further comprising using a first scan enable signal for said first timing test and using a second scan enable signal for said second timing test, said first scan enable signal being different that said second scan enable signal.

5. The method according to claim 1, said first timing test and said second timing test comprising alternating current testing using multiple test clock signals delayed from one another.

6. The method according to claim 1, said first timing test and said second timing test comprising at speed testing using a feedback loop as a toggle to test downstream logic within said clock domains and to block clock signals that are transmitted between said clock domains.

7. A computer-implemented method of testing clock domains within an integrated circuit structure, said method comprising:
    blocking clock inputs to said clock domains using test equipment;
    while said clock domain inputs are blocked, performing a first timing test only of signals that are transmitted within said clock domains using a computer by only observing latches that receive signals from sources within said clock domains;
    unblocking said clock inputs to said clock domains using said computer; and
    while said clock domain inputs are unblocked, performing a second timing test only of signals that are transmitted between said clock domains by only observing latches that receive signals from other clock domains.

8. The method according to claim 7, said first timing test comprising simultaneously testing said signals that are transmitted within said clock domains.

9. The method according to claim 7, said second timing test comprising sequentially testing said signals that are transmitted between said clock domains.

10. The method according to claim 7, further comprising using a first scan enable signal for said first timing test and using a second scan enable signal for said second timing test, said first scan enable signal being different that said second scan enable signal.

11. The method according to claim 7, said first timing test and said second timing test comprising alternating current testing using multiple test clock signals delayed from one another.

12. The method according to claim 7, said first timing test and said second timing test comprising at speed testing using a feedback loop as a toggle to test downstream logic within said clock domains and to block clock signals that are transmitted between said clock domains.

13. A system for testing clock domains within integrated circuit structures, said system comprising:
    an integrated circuit structure;
    a plurality of clock domains within said integrated circuit structure, each clock domain comprising a different section of said integrated circuit, and each clock domain operating according to a different clock signal;

controllers positioned within each of said clock domains, said controllers blocking and unblocking clock inputs to said clock domains;

a tester operatively connected to said controllers, while said clock domain inputs are blocked by said controllers said tester performs a first timing test only of signals that are transmitted within said clock domains by only observing latches that receive signals from sources within said clock domains, and while said clock domain inputs are unblocked by said controllers, said tester performs a second timing test only of signals that are transmitted between said clock domains by only observing latches that receive signals from other clock domains.

14. The system according to claim 13, said first timing test comprising simultaneously testing said signals that are transmitted within said clock domains.

15. The system according to claim 13, said second timing test comprising sequentially testing said signals that are transmitted between said clock domains.

16. The system according to claim 13, said tester using a first scan enable signal for said first timing test and using a second scan enable signal for said second timing test, said first scan enable signal being different that said second scan enable signal.

17. The system according to claim 13, said first timing test and said second timing test comprising alternating current testing using multiple test clock signals delayed from one another.

18. The system according to claim 13, further comprising a feedback loop operatively connected to said controllers, said first timing test and said second timing test comprising at speed testing using said feedback loop as a toggle to test downstream logic within said clock domains and to block clock signals that are transmitted between said clock domains.

19. An integrated circuit structure comprising:

a plurality of clock domains, each clock domain comprising a different section of said integrated circuit, and each clock domain operating according to a different clock signal;

controllers positioned within each of said clock domains, said controllers blocking and unblocking clock inputs to said clock domains;

a processor operatively connected to said clock domains, while said clock domain inputs are blocked by said controllers said processor performs a first timing test only of signals that are transmitted within said clock domains by only observing latches that receive signals from sources within said clock domains, and while said clock domain inputs are unblocked by said controllers, said processor performs a second timing test only of signals that are transmitted between said clock domains by only observing latches that receive signals from other clock domains.

20. The structure according to claim 19, said first timing test comprising simultaneously testing said signals that are transmitted within said clock domains.

21. The structure according to claim 19, said second timing test comprising sequentially testing said signals that are transmitted between said clock domains.

22. The structure according to claim 19, said processor using a first scan enable signal for said first timing test and using a second scan enable signal for said second timing test, said first scan enable signal being different that said second scan enable signal.

23. The structure according to claim 19, said first timing test and said second timing test comprising alternating current testing using multiple test clock signals delayed from one another.

24. The structure according to claim 19, further comprising a feedback loop operatively connected to said controllers, said first timing test and said second timing test comprising at speed testing using said feedback loop as a toggle to test downstream logic within said clock domains and to block clock signals that are transmitted between said clock domains.

* * * * *